US009778493B1

(12) United States Patent
Krishnamoorthy et al.

(10) Patent No.: US 9,778,493 B1
(45) Date of Patent: Oct. 3, 2017

(54) DUAL-RING-MODULATED LASER THAT USES PUSH-PUSH/PULL-PULL MODULATION

(71) Applicant: Oracle International Corporation, Redwood Shores, CA (US)

(72) Inventors: Ashok V. Krishnamoorthy, San Diego, CA (US); Jock T. Bovington, La Jolla, CA (US); Xuezhe Zheng, San Diego, CA (US); Ying Luo, San Diego, CA (US); Shiyun Lin, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/409,381

(22) Filed: Jan. 18, 2017

Related U.S. Application Data

(60) Provisional application No. 62/398,149, filed on Sep. 22, 2016.

(51) Int. Cl.
*G02F 1/01* (2006.01)
*H01S 5/026* (2006.01)
(Continued)

(52) U.S. Cl.
CPC ............ *G02F 1/011* (2013.01); *H01S 5/0265* (2013.01); *H01S 5/125* (2013.01); *H01S 5/3013* (2013.01);
(Continued)

(58) Field of Classification Search
CPC ............... G02F 1/011; G02F 2201/126; G02F 2203/15; G02F 2203/70; G02F 2201/34;
(Continued)

(56) References Cited

U.S. PATENT DOCUMENTS

| 4,667,331 | A | * | 5/1987 | Alferness | H01S 3/083 372/20 |
| 5,684,899 | A | * | 11/1997 | Ota | G02B 6/12007 385/14 |

(Continued)

OTHER PUBLICATIONS

Reed et al.; "Silicon optical modulators," Nature Photonics 4 (8), 518-526 (2010).

(Continued)

*Primary Examiner* — Akm Enayet Ullah
(74) *Attorney, Agent, or Firm* — Park, Vaughan, Fleming & Dowler LLP

(57) ABSTRACT

A dual-ring-modulated laser includes a gain medium having a reflective end coupled to an associated gain-medium reflector and an output end, which is coupled to a reflector circuit through an input waveguide to form a lasing cavity. The reflector circuit comprises: a first ring modulator; a second ring modulator; and a shared waveguide that optically couples the first and second ring modulators together. The first and second ring modulators have resonance peaks that are tuned to be offset in alignment from each other to provide an effective reflectance having a flat-top response, which is aligned with an associated lasing cavity mode. The first and second ring modulators are driven in tandem based on the same electrical input signal, whereby the resonance peaks of the first and second ring modulators shift wavelengths in the same direction during modulation, and an effective reflectance stays within the flat-top wavelength range.

20 Claims, 10 Drawing Sheets

(51) Int. Cl.
  H01S 5/125  (2006.01)
  H01S 5/30   (2006.01)
  H01S 5/50   (2006.01)

(52) U.S. Cl.
  CPC .......... *H01S 5/50* (2013.01); *G02F 2201/126* (2013.01); *G02F 2201/34* (2013.01); *G02F 2203/15* (2013.01); *G02F 2203/70* (2013.01)

(58) Field of Classification Search
  CPC . H01S 5/142; H01S 5/50; H01S 5/125; H01S 5/0265
  USPC ......... 385/2, 14, 16, 24; 372/6, 9, 1, 20, 50, 372/92, 94, 98
  See application file for complete search history.

(56) References Cited

U.S. PATENT DOCUMENTS

| | | | |
|---|---|---|---|
| 2008/0219614 A1 | 9/2008 | Gill | |
| 2009/0122817 A1 | 5/2009 | Sato | |
| 2009/0324163 A1 | 12/2009 | Dougherty | |
| 2010/0322269 A1* | 12/2010 | Liu | H01S 5/141 372/20 |
| 2010/0322555 A1* | 12/2010 | Vermeulen | G02B 6/12007 385/28 |
| 2012/0189025 A1 | 7/2012 | Zheng | |
| 2013/0301981 A1* | 11/2013 | Li | G02B 6/136 385/14 |
| 2014/0226684 A1* | 8/2014 | Krishnamoorthy | H01S 5/021 372/20 |
| 2014/0268312 A1* | 9/2014 | Zheng | H01S 5/1028 359/344 |
| 2016/0204578 A1* | 7/2016 | Li | H01S 5/142 372/20 |
| 2017/0139237 A1* | 5/2017 | Luo | G02F 1/011 |

OTHER PUBLICATIONS

Li et al.; "25 Gb/s, 1V-driving, CMOS ring modulator with integrated thermal tuning," Optics Express 19 (21), 20435-20443 (2011).

Fujioka et al; "Compact and low power consumption hybrid integrated wavelength tunable laser module using silicon waveguide resonators," J. of Lightwave Technology 28 (21), 3115-3120 (2010).

Akiyama et al.; "A Novel Transmitter Leveraging High-Speed Ultralow-Power Modulation of a Si Microring Modulator by Eliminating Tuning Power," Proc. Optical Fiber Communications Conference (OFC), Paper M2C.4, Mar. 2016.

Xiao et al.; "60 Gbit/s silicon modulators with enhanced electrooptical efficiency," in Opt. Fiber Commun. Conf. Fiber Opt. Eng. Conf. 2013 (Optical Society of America, 2013), paper OW4J3.

* cited by examiner

DUAL-RING-MODULATED LASER THAT USES PUSH-PUSH/PULL-PULL MODULATION

RELATED APPLICATIONS

This application claims priority under 35 U.S.C. §119 to U.S. Provisional Application No. 62/398,149, entitled "Dual-Ring-Modulated Lasers" by the same inventors as the instant application, filed on 22 Sep. 2016 the contents of which are incorporated by reference.

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments generally relate to the design of a semiconductor-based laser. More specifically, the disclosed embodiments relate to the design of a dual-ring-modulated laser, wherein the rings are modulated in tandem.

RELATED ART

Silicon photonics holds the promise of revolutionizing high-performance computing by removing its communication bottlenecks. An efficient high-speed optical modulator is one of the most important components in a silicon photonic link. The function of the optical modulator is to convert a high-speed electrical data signal into optical form. The basic requirements of this device are: high speed, low power consumption, low optical loss, high ON/OFF extinction ratio (ER), and compact size. To date, most reported silicon high-speed modulators operate based on the free-carrier plasma dispersion effect: the optical refractive index of the silicon material reduces with increased densities of electrons and holes (i.e., free carriers). To use this effect for data modulation, one has to electrically modulate the carrier densities in the optical waveguide; thus, the optical refractive index is modulated, and the optical phase of the propagating laser light is modulated. This phase modulation can then be converted into optical-intensity modulation (i.e., ON/OFF switching) by building the phase modulation waveguide into a ring resonator as illustrated in FIG. 1A or into a Mach-Zehnder interferometer (MZI) as illustrated in FIG. 1B.

Ring modulators utilize strong resonances for modulation; thus, they can achieve large ER even with weak phase modulation. (See G. Li, et al., "25 Gb/s, 1V-driving, CMOS ring modulator with integrated thermal tuning," *Optics Express* 19 (21), 20435-20443, 2011.) The drawback of ring modulators is that they require precise and dynamic tuning to align their resonances with the laser wavelength. This tuning can consume large amounts of electrical power and may require large and complex control circuits. In contrast, MZI modulators do not require such precise and dynamic tuning, but they do require much stronger phase modulation to achieve a large ER. As a consequence, MZI modulators are typically very long, and consume a significant amount of modulation power.

Hence, what is needed is a compact, low-power and high-speed modulator, which is well-aligned to the lasing wavelength without consuming an excessive amount of power and without requiring extremely precise tuning.

SUMMARY

The disclosed embodiments relate to a system that provides a dual-ring-modulated laser, which includes a gain medium having a reflective end coupled to an associated gain-medium reflector and an output end. The output end of the gain medium is coupled to a reflector circuit through an input waveguide to form a lasing cavity. This reflector circuit includes: a first ring modulator; a second ring modulator; and a shared waveguide that optically couples the first and second ring modulators together, wherein the first and second ring modulators have resonance peaks, which are tuned to have an alignment separation from each other. During operation, a push-pull drive circuit is used to drive the first and second ring modulators in opposing directions based on the same electrical input signal, so that the resonance peaks of the first and second ring modulators shift wavelengths in the opposing directions during modulation, wherein the modulation shift for each of the resonance peaks substantially equals the alignment separation, so that the resonance peaks interchange positions during modulation to cancel out reflectivity changes in the lasing cavity caused by the modulation. Finally, an output waveguide is optically coupled to the lasing cavity to produce a laser output.

In some embodiments, the reflector circuit additionally comprises: a first intermediate waveguide optically coupled to the first ring modulator, a second intermediate waveguide optically coupled to the second ring modulator; and an optical splitter, which splits an optical signal received from the input waveguide to produce a first optical signal that feeds into the first intermediate waveguide, and a second optical signal that feeds into the second intermediate waveguide. The first optical signal on the first intermediate waveguide is split through partial optical coupling with the first ring modulator to produce a first output component that provides a first output for the laser, and a first reflected component that circulates clockwise in the first ring modulator, passes through the shared waveguide, circulates clockwise in the second ring modulator, and returns through the second intermediate waveguide and the optical splitter to the gain medium. Similarly, the second optical signal on the second intermediate waveguide is split through partial optical coupling with the second ring modulator to produce a second output component that provides a second output for the laser, which is complementary to the first output, and a second reflected component that circulates counterclockwise in the second ring modulator, passes through the shared waveguide, circulates counterclockwise in the first ring modulator, and returns through the first intermediate waveguide and the optical splitter to the gain medium.

In some embodiments, the reflector circuit additionally comprises: a reflector; and a reflector waveguide. Moreover, the input waveguide is optically coupled to the first ring modulator, the first ring modulator is optically coupled to the second ring modulator through the shared waveguide, and the second ring modulator is optically coupled to the reflector though the reflector waveguide. During operation, an optical signal from the gain medium traverses a path that passes through the input waveguide, circulates around the first ring modulator, passes through the shared waveguide, circulates around the second ring modulator, and passes through the reflector waveguide to the reflector, which reflects the light back down the path in a reverse direction to the gain medium.

In some embodiments, the input waveguide is optically coupled to the first ring modulator, and the gain-medium reflector comprises a reflector waveguide, which is connected to the reflective end of the gain medium and is optically coupled to the second ring modulator. During operation, the gain medium generates a first optical signal that passes through the input waveguide and is split through partial optical coupling with the first ring modulator to produce: a first output component that provides a first output for the laser; and a first reflected component that circulates counterclockwise in the first ring modulator, passes through the shared waveguide, circulates counterclockwise in the second ring modulator, and returns through the reflector waveguide to the gain medium. The gain medium also generates a second optical signal that passes through the reflector waveguide and is split through partial optical coupling with the second ring modulator to produce: a second output component that provides a second output for the laser, which is complementary to the first output; and a second reflected component that circulates clockwise in the second ring modulator, passes through the shared waveguide, circulates clockwise in the first ring modulator, and returns through the input waveguide to the gain medium.

In some embodiments, the first and second ring modulators have different radii, which causes a Vernier effect that provides a combined tuning range that is larger than the gain bandwidth of the gain medium.

In some embodiments, the gain-medium reflector comprises one of the following: a reflective facet coupled to the reflective end of the gain medium so that the gain medium and the reflective facet form a reflective semiconductor optical amplifier (RSOA); a waveguide loop mirror coupled to the reflective end of the gain medium; or a distributed Bragg waveguide (DBR) mirror coupled to the reflective end of the gain medium.

In some embodiments, the gain medium is located on a gain chip, which is separate from a semiconductor chip that includes the reflector circuit and other components of the dual-ring-modulated laser.

The disclosed embodiments also relate to another system that provides a dual-ring-modulated laser, which includes a gain medium having a reflective end coupled to an associated gain-medium reflector and an output end. The output end of the gain medium is coupled to a reflector circuit through an input waveguide to form a lasing cavity. This reflector circuit comprises: a first ring modulator; a second ring modulator; and a shared waveguide that optically couples the first and second ring modulators together. The first and second ring modulators have resonance peaks that are tuned to be offset in alignment from each other, so that the reflector circuit provides an effective reflectance having a flat-top response across a flat-top wavelength range, which is aligned with an associated lasing cavity mode. During operation, a push-push/pull-pull drive circuit is used to drive the first and second ring modulators in tandem based on the same electrical input signal, so that the resonance peaks of the first and second ring modulators shift wavelengths in the same direction during modulation, and an effective reflectance of the reflector circuit, which includes contributions from the first and second ring modulators, stays within the flat-top wavelength range. Finally, an output waveguide is optically coupled to the lasing cavity to produce a laser output.

DETAILED DESCRIPTION

Figure 1A:
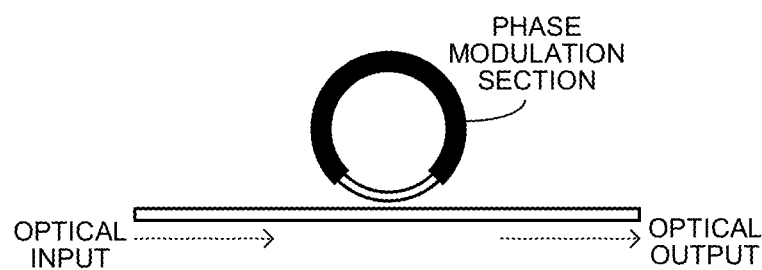
FIG. 1A illustrates a ring modulator in accordance with the disclosed embodiments.
Figure 1B:
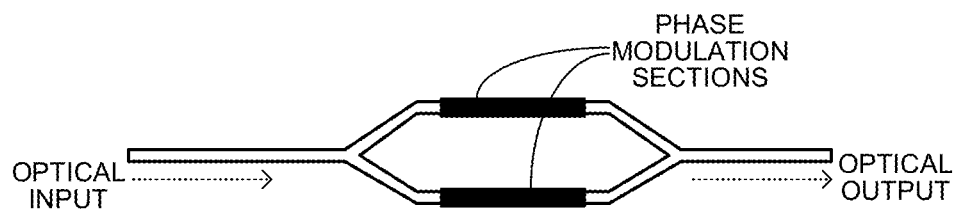
FIG. 1B illustrates a Mach-Zehnder modulator in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

The disclosed embodiments provide a new technique for modulating a high-speed silicon photonic device that combines a dual-ring modulator with an external-cavity laser to form a dual-ring-modulated laser (DRML). More specifically, the disclosed embodiments teach a method of using a dual-ring modulator in a III-V/Si hybrid laser to modulate the overall output transmission of each ring without significantly affecting the overall reflectivity of the dual-ring mirror. This permits the modulation bandwidth of the laser output to approach the ring resonators' photon lifetime limit without being limited by the laser cavity lifetime.

During a push-pull operating mode, this DRML minimizes phase and/or path-length changes to facilitate low-chirp, or even chirp-free operation. More specifically, in this push-pull operating mode, a first ring modulator modulates clockwise circulating light obtained from its input bus, and a second ring modulator effectively applies an equal and opposite phase change before returning its output to the gain section of the cavity, and vice-versa for counterclockwise circulating light. Because the gain medium is not modulated, the modulation bandwidth is independent of any current-injection-related laser resonance. Moreover, the lasing wavelength is determined by the overlap of the dual-ring filter with the cavity mode resonance.

A phase tuner can be used to enable the lasing wavelength to be independently controlled and positioned to the optimal bias point of the ring modulators to optimize modulation efficiency while maintaining overall mirror reflectivity and keeping phase delay constant. Note that a small amount of tuning is needed for each ring to optimize the relative position of the ring resonances and the available modulation swing.

This new dual-ring modulator design provides a differential output with a high-contrast ratio. Moreover, it is symmetric, so that a first ring provides the modulated output while the second ring provides the bias and compensates for minimum reflectivity and phase changes. This push-pull operating mode eliminates both intensity-related and phase-related cavity fluctuations completely to provide a low-chirp, high-speed modulated laser. The tradeoff is that the resulting laser is biased "off-center" with respect to the cavity mode; hence, the side-mode-suppression ratio can be limited, which can possibly lead to mode-hopping. However, note that this limited side-mode-suppression ratio can be improved by using a shorter overall lasing cavity with a correspondingly larger mode spacing.

Also, a push-push/pull-pull operating mode is disclosed, which provides differential outputs and constant reflectivity. During this push-push/pull-pull operating mode, both rings are modulated in tandem (in a push-push/pull-pull manner) to achieve corresponding differential outputs on two separate output waveguides. By using push-push/pull-pull modulation, the lasing wavelength can be biased near or at the peak of the cavity mode, which can improve suppression of side modes if high-quality-factor rings are used. Also, a single driver can be used to modulate both rings, and thermal tuning can be used to bias the rings relative to each other. Note that the push-push/pull-pull operating mode can provide minimized cavity intensity fluctuations and can potentially improve side-mode suppression for the same cavity length. The tradeoff is that the associated phase-change-induced chirp, which can limit modulation speed because of cavity effects, can also induce dispersion during fiber data transmission because of the relative differences in speed versus wavelength for a fiber.

Implementation Details

Figure 2A:
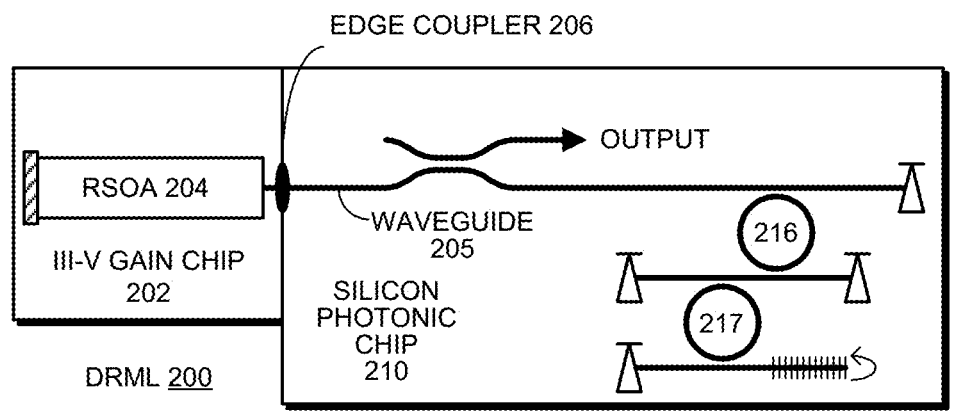
FIG. 2A illustrates a configuration for a ring-modulated laser in accordance with the disclosed embodiments.
Figure 2B:
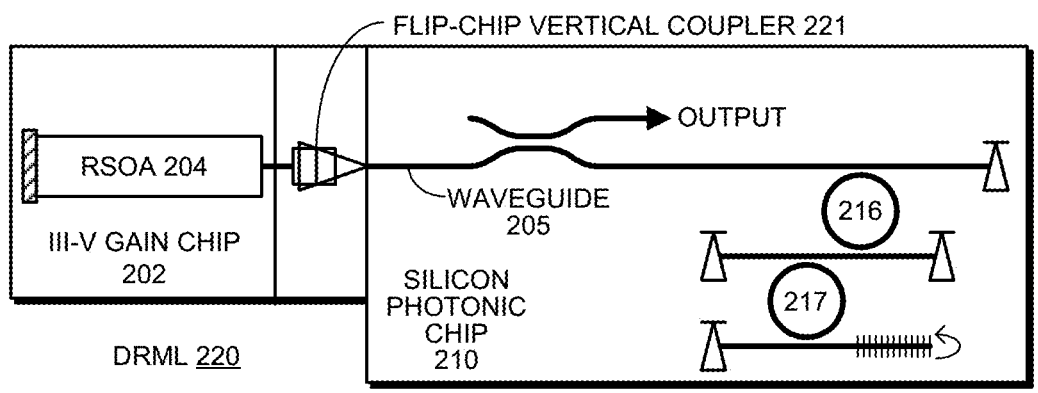
FIG. 2B illustrates another configuration for a ring-modulated laser in accordance with the disclosed embodiments.
Figure 2C:
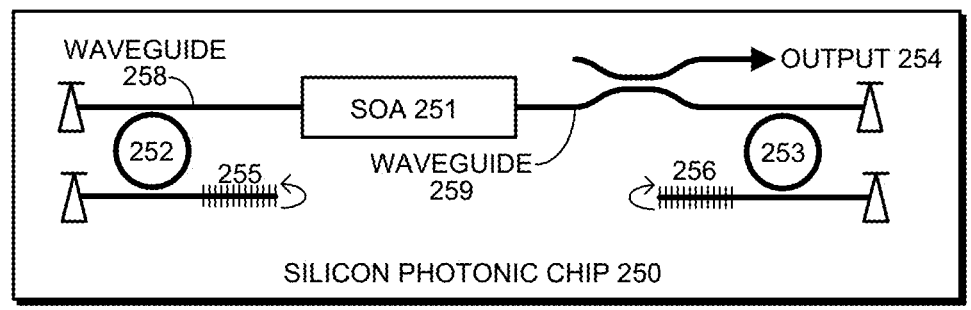
FIG. 2C illustrates yet another configuration for a ring-modulated laser in accordance with the disclosed embodiments.

We previously developed a number of novel dual-ring-modulated laser (DRML) structures on silicon, which are illustrated in FIGS. 2A-2C. (See U.S. patent application Ser. No. 14/062,624, entitled "Ring-Modulated Laser" by inventors Guoliang Li, et al., filed 24 Oct. 2016, which is incorporated by reference herein.) DRML 200 illustrated in FIG. 2A uses an edge coupler 206 between an RSOA 204 located on a III-V gain chip 202 and a silicon waveguide 205 located on a silicon photonic chip 210. In contrast, DRML 220 illustrated in FIG. 2B uses a flip-chip vertical coupler 221 between RSOA 204 and silicon waveguide 205. Finally, DRML 240 illustrated in FIG. 2C uses evanescent coupling using flip-chip or wafer bonding between SOA 251 and silicon waveguides 258-259 located on silicon photonic chip 250. These waveguides 258-259 are optically coupled to ring modulators 252-253, respectively, and are terminated with absorbers/deflectors (triangle symbols) and total reflectors 255-256 (grating symbols).

The DRML structures illustrated in FIGS. 2A-2C integrate dual-ring modulators 216-217 and 252-253 into the laser cavity as a mirror. Moreover, the resonances of the two ring modulators can be push-pull modulated so that the overall reflection peak wavelength is unchanged, but the overall reflectivity is modulated, which modulates the output laser power. Note that the lasing wavelength is determined by the ring modulator resonance; thus, there is no need to tune the ring resonance to the laser wavelength. While RMLs 200, 220 and 240 illustrated in FIGS. 2A-2C are operating, reflectivity changes during modulation can limit the overall bandwidth, not only due to reductions in modulator bandwidth, but also due to the photon lifetime of the overall laser cavity. Hence, the modulation bandwidth can be degraded compared to an external ring modulator.

Ring resonators have been used as laser reflectors/mirrors for some time due to their excellent wavelength selectivity and easy tunability. Moreover, double rings having different sizes can be used to create a Vernier effect to provide a large free spectral range (FSR), for example greater than 40 nm. This is because the gain medium has a wide gain spectrum, ~40 nm, and a large FSR helps to prevent unstable simultaneous multi-wavelength lasing.

Figure 3:
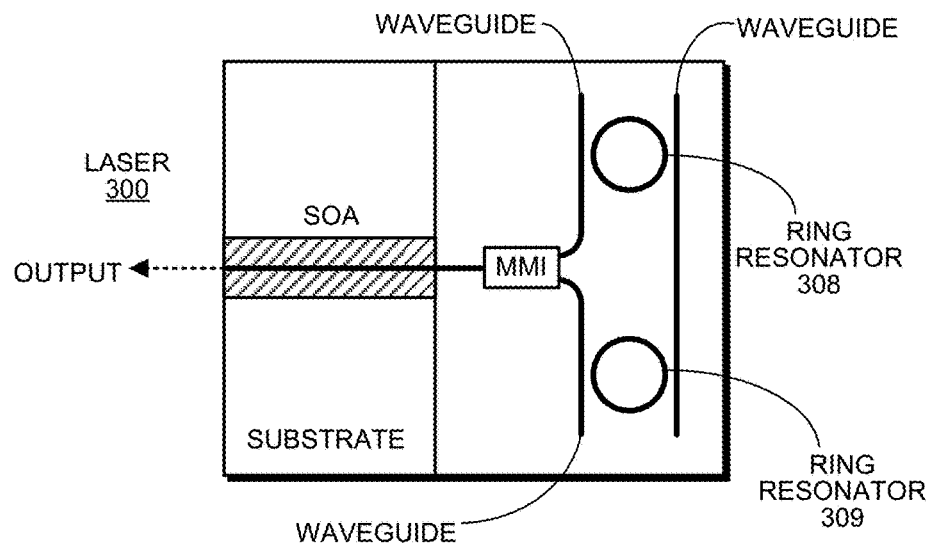
FIG. 3 illustrates a laser that uses dual-ring resonators as laser mirrors in accordance with the disclosed embodiments.

FIG. 3 illustrates an exemplary use of a dual-ring mirror filter to produce a laser 300. (See N. Fujioka, T. Chu, and M. Ishizaka, "Compact and low power consumption hybrid integrated wavelength tunable laser module using silicon waveguide resonators," *J. of Lightwave Technology* 28 (21), 3115-3120, 2010.) Note that the ring resonators 308-309 illustrated in FIG. 3 can be replaced with ring modulators to create a new dual ring-modulated laser (DRML) as is described in more detail below.

Figure 4:
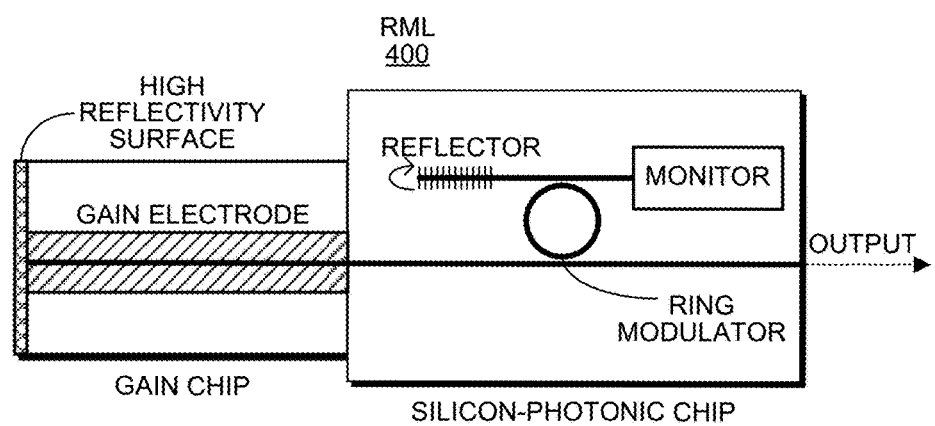
FIG. 4 illustrates a single-ring-modulated laser in accordance with the disclosed embodiments.

The idea of creating a "ring-modulated laser" (RML) 400 was recently proposed by some researchers as is illustrated in FIG. 4. (See T. Akiyama, et al., "A Novel Transmitter Leveraging High-Speed Ultralow-Power Modulation of a Si Microring Modulator by Eliminating Tuning Power," Proc. Optical Fiber Communications Conference (OFC), Paper M2C.4, March 2016.) These researchers demonstrated that the intra-cavity light power variation can be minimized while the output power is modulated at high speed. However, because a single ring is used, this causes a performance tradeoff during modulation. In particular, the reflectivity and phase changes caused by the ring mirror during modulation can limit speed and can cause chirp-related signal deterioration.

New Dual-Ring-Modulated Laser

As discussed above, it is desirable to provide a laser with a large extinction ratio, and which is capable of very high-speed operation (e.g., 100 Gbps and higher). This can be accomplished through a new DRML design, which removes intra-cavity power variations in the lasing cavity, hence overcoming laser-cavity photon-lifetime limits.

Figure 5A:
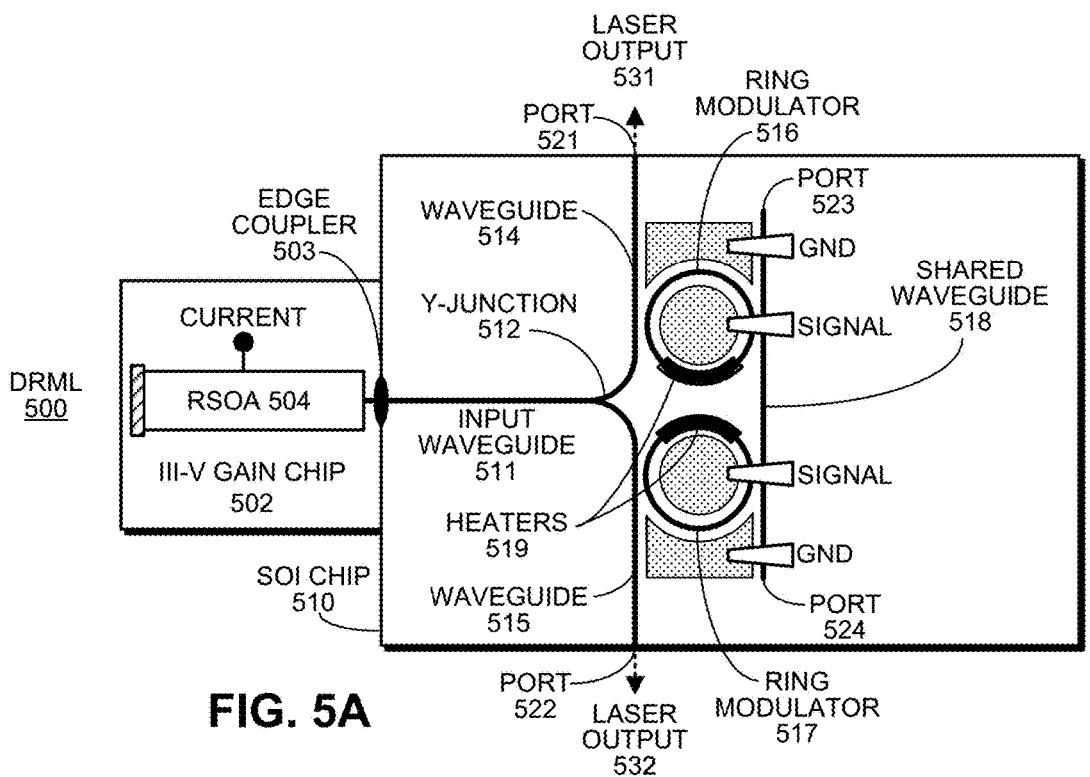
FIG. 5A illustrates a dual-ring-modulated laser in accordance with the disclosed embodiments.

FIG. 5A presents a schematic of this new DRML design 500. In this new design, an RSOA 504 located on a III-V gain chip 502 is connected to an input waveguide 511 on an SOI chip 510 via an edge coupler 503. However, other configurations are anticipated. For instance, the III-V gain chip 502 can be surface-normal coupled to SOI chip 510 using grating couplers and a turning mirror (not shown).

Next, a Y-junction splitter 512 splits the light from input waveguide 511 into two components that feed into two intermediate waveguides 514 and 515, which are optically coupled to ring modulators 516 and 517, respectively. (Note that a 1×2 multi-mode interference (MMI) device or a directional coupler with a 50-50 split ratio could optionally used in place of the Y-junction splitter 512.) Also note that ring modulators 516-517 include heaters 519, which can be used to tune their respective wavelengths. Finally, an optional phase shifter (not shown) can be incorporated into either the III-V gain chip 502 or the SOI chip 510 before Y-junction 512 to tune the lasing peak with respect to the ring resonances. (This tuning can also be achieved by using ring tuners that add a constant bias to both rings.) Finally, ring modulators 516-517 are optically coupled to each other through a shared waveguide 518.

In the DRML 500 illustrated in FIG. 5A, high-speed ring modulators 516 and 517 are integrated into the laser cavity. Ideally, we can use ring modulators with small rings that provide a large FSR. For example, a ring with radius of <5 µm can have FSR >20 nm and may be modulated beyond 60 Gbit/s. (See X. Xiao, H. Xu, X. Li, Z. Li, T. Chu, J. Yu, and Y. Yu, "60 Gbit/s silicon modulators with enhanced electrooptical efficiency," in Opt. Fiber Commun. Conf. Fiber Opt. Eng. Conf. 2013 (Optical Society of America, 2013), paper OW4J3.)

After the light from input waveguide 511 is split into two components by Y-junction 512, a first component on intermediate waveguide 514 is split through partial optical coupling with the ring modulator 516 to produce an output component that provides a laser output 531 through port 521, and a reflected component that: circulates clockwise in the ring modulator 516; passes through shared waveguide 518; circulates clockwise in ring modulator 517; and returns through intermediate waveguide 515 and Y-junction 512 to RSOA 504.

At the same time, a second component on intermediate waveguide 515 is split through partial optical coupling with the ring modulator 517 to produce an output component that provides a laser output 532 through port 522, and a reflected component that; circulates counterclockwise in the ring modulator 517; passes through shared waveguide 518; circulates counterclockwise in ring modulator 516; and returns through intermediate waveguide 514 and Y-junction 512 to RSOA 504. (Note that laser outputs can alternatively be provided through ports 523-524 or through an output waveguide, which is coupled to input waveguide 511.)

Note that the lasing wavelength is determined by the pair of ring resonances; hence, there is no need to tune the ring modulator resonance to align it with an external laser wavelength. This allows use of highly efficient and compact ring modulators without requiring significant tuning.

Figure 5B:
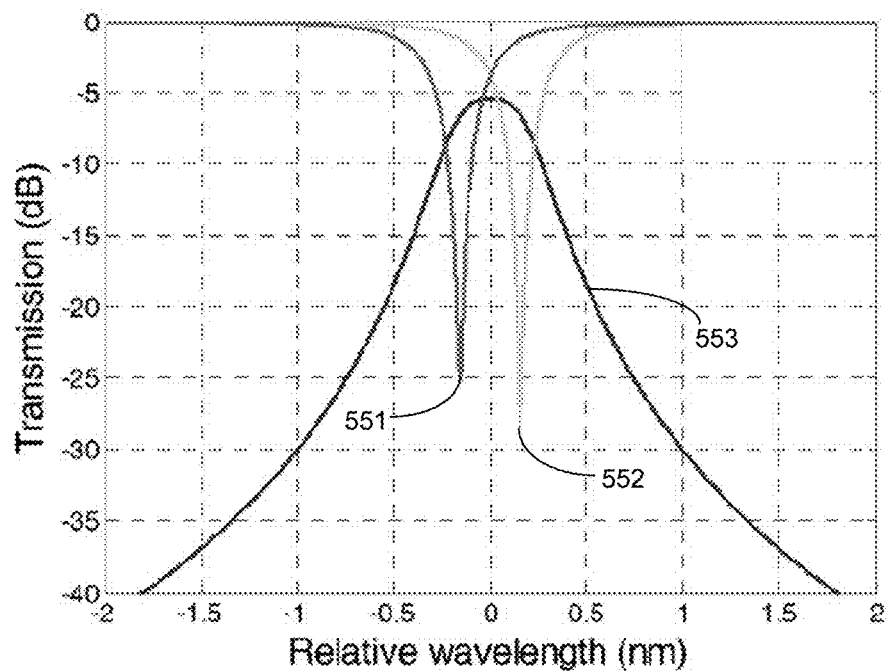
FIG. 5B presents a graph illustrating a transmission response for a dual-ring-modulated laser in accordance with the disclosed embodiments.

FIG. 5B presents a graph illustrating performance of the DRML 500 illustrated in FIG. 5A. The line 551 illustrates through-port transmission for ring modulator 516, and the line 552 illustrates through-port transmission for ring modulator 517. Note that the resonance-associated dips for ring modulators 516 and 517 are offset from each other. Finally, the line 553 illustrates the effective round-trip reflectivity (RTR) of the two ring drop ports created by offsetting the resonances.

Push-Pull Modulation

Figure 6A:
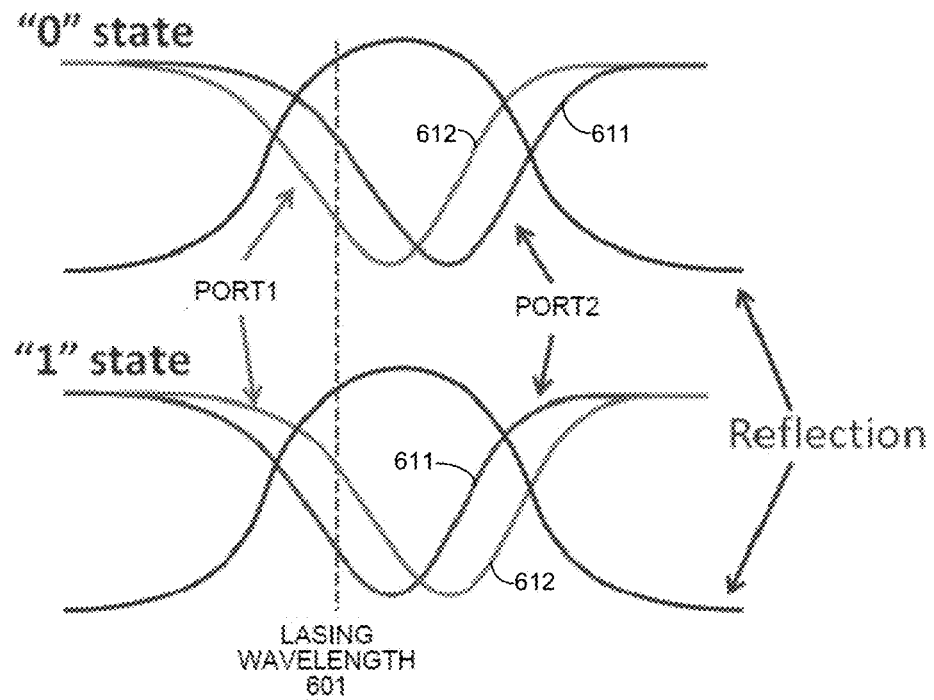
FIGS. 6A and 6B present graphs illustrating the transmission response for a dual-ring-modulated laser, wherein both rings are modulated in tandem in accordance with the disclosed embodiments.
Figure 6B:
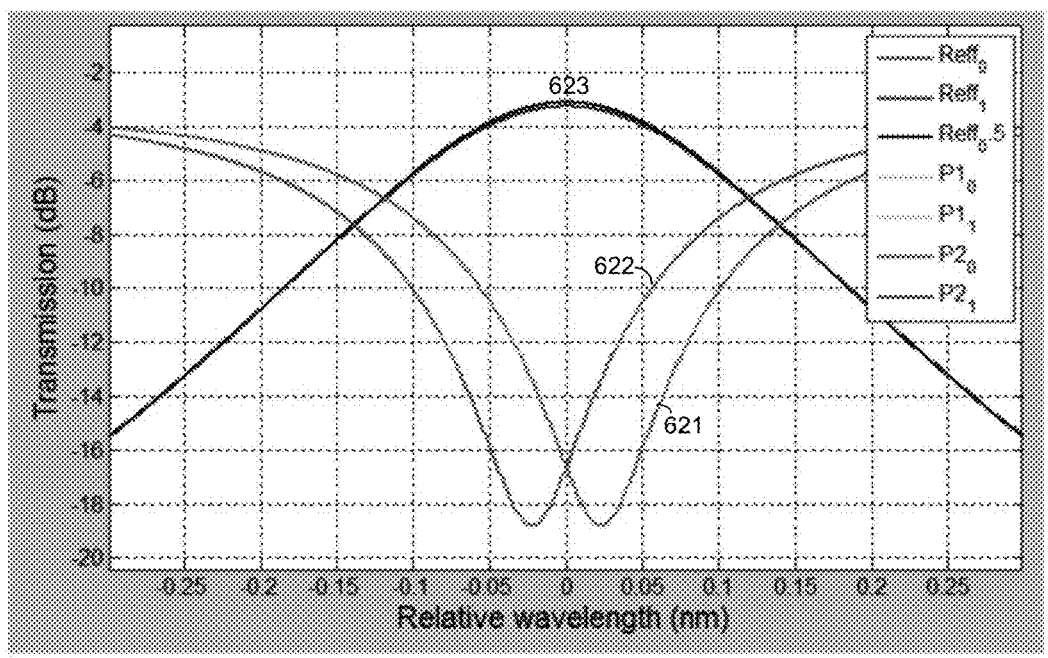

Using push-pull modulation in DRML 500 can provide significant advantages. For example, FIGS. 6A and 6B illustrate how the two ring modulators 516-517 in DRML 500 can be tuned away from each so that the separation of the resonances is exactly equal to the intended modulation shift. In this case, push-pull modulation can be used to interchange the position of the two peaks to cancel out any overall accumulated reflectivity change in the cavity. This is illustrated in FIG. 6A, which shows how the 611 and 612 resonance peaks for the ring-resonator modulators interchange between the "0" state and the "1" state. For this condition to hold, the laser can be positioned at any location in the overall reflectivity curve, not just the peak. However, it is desirable to operate near the peak so the lasing mode will experience less loss, and especially because any neighboring potentially competitive modes will be correspondingly suppressed. The lasing mode is ideally positioned either to the left of the first (left) resonance at lasing wavelength 601 in FIG. 6A, or alternatively to the right of the second (right) resonance so as to operate with high contrast and reasonable output power. However, note that these operating points are slightly offset from the through-port minima and the peak reflectivity. To illustrate changes in reflectively, FIG. 6B illustrates 621 and 622 resonance peaks together with an overall 623 reflectivity curve. This figure indicates that only minimal changes in reflectivity occur during modulation.

An ideal DRML would have a large ratio of modulation shift ($\Delta\lambda$) in comparison to the resonator's full-width-half-max (FWHM). In addition, a shorter laser cavity, which has larger spacing of modes is preferred. Hence, in practice there is a tradeoff in terms of aligning the lasing peak of the modulated power-versus-extinction ratio for a given modulation shift while also suppressing spurious lasing modes. Nevertheless, a push-pull modulated DRML provides an extremely useful low-chirp, directly modulated laser that can be modulated at high speeds in a manner that is limited only by the ring-modulator itself, and not by electron-photon laser resonance or by round-trip cavity effects.

Another important advantage of the push-pull-modulated DRML is the accumulated phase per round trip. Because the rings are symmetrically modulated with two drops per pass (input dropped to shared bus and shared bus dropped to input), the difference between the accumulated round-trip phase between the zero and one states is very small; hence, there will be little to no chirp. Because the modulation is symmetrical, there is also no difference between the clockwise and counterclockwise waves. Hence, stable, low-chirp, single-mode differential outputs will be obtained from laser outputs 531 and 532 illustrated in FIG. 5A during modulation. Furthermore, this condition will hold even under asymmetrical coupling from the input bus to ring, and the ring to the shared bus, so long as the coupling conditions for both rings to both corresponding input and shared buses are symmetric.

Push-Push/Pull-Pull Modulation

For the push-push/pull-pull operating mode, the two rings can be designed as identical modulators. To maintain the effective reflectance of the silicon chip, and hence avoid the laser re-establishing itself during ON and OFF conditions, the resonances of these two rings can be intentionally pushed away from each other using the metal heaters 519, which are illustrated in FIG. 5A. This provides an effective "flat-top" reflectance, which means that RSOA 504 in III-V gain chip 502 will not see any changes in reflectance when the two rings are modulated within the "flat-top" wavelength range. Hence, this hybrid laser gain behaves similarly to a continuous-wave (CW) light source, without involving any turn-on delay or large signal bandwidth limitations, as occurs with directly modulated lasers. Moreover, the lasing-cavity power, and hence the photon lifetime, will not significantly change with modulation in the silicon external cavity. Hence, the modulation speed of the ring modulated laser is determined by the speed of the ring modulator, rather than the laser cavity lifetime.

Referring to FIG. 5A, note that III-V gain chip 502 has one optical waveguide port attached to edge coupler 503, and SOI chip 510 has five ports (including the I/O port coupled through edge coupler 503 to the III-V gain-chip 502, and four additional ports 521-524), which are accessible once the device is assembled. In this configuration, output ports at 521 and 522 provide the best differential outputs and will have a good ER with low loss if the shared waveguide 518 and the ring modulators 516-517 are critically coupled for ports 523-524. During the design process, the coupling coefficients of the two ring modulators 516-517 should ideally be optimized to get the best modulation amplitude at the desired output port.

If the rings are identical, then it is desirable to use the very small rings (e.g., having a radius of 3-5 microns) so as to maximize the FSR of the rings and prevent lasing at multiple peaks or spurious mode-hopping in the laser. A useful technique to remove spurious lasing modes is to design the two rings to have slightly different sizes to achieve a larger tuning range using the Vernier effect. This also enables the rings themselves to be slightly larger, and hence more practically fabricated, because the FSR of a Vernier pair can easily be designed to greatly exceed the gain bandwidth of the gain material.

Figure 6C:
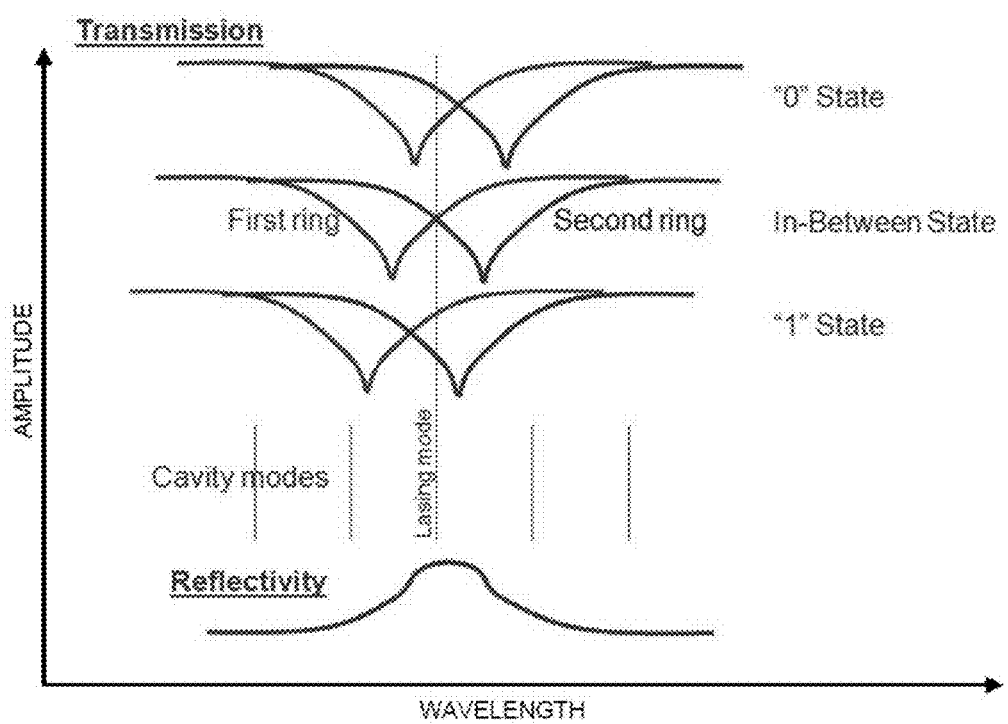
FIG. 6C presents a graph illustrating both transmission and reflectivity responses for the two rings during push-push/pull-pull modulation in accordance with the disclosed embodiments.

Note that during push-push/pull-pull modulation, both rings are shifted in the same direction, and overall reflectivity through the rings is maintained for both counterclockwise and clockwise paths as is illustrated in FIG. 6C. Again, note that only a small amount of tuning is required to optimize ER and ensure optimum overlap to a lasing cavity mode as shown in FIG. 6C. Note that the push-push/pull-pull operating mode maximizes operating efficiency because both counterclockwise and clockwise propagating modes have their corresponding modulated outputs appear at ports 523-524, respectively, assuming their corresponding waveguides are critically coupled to their respective ring modulators.

Alternative Configurations

Figure 7A:
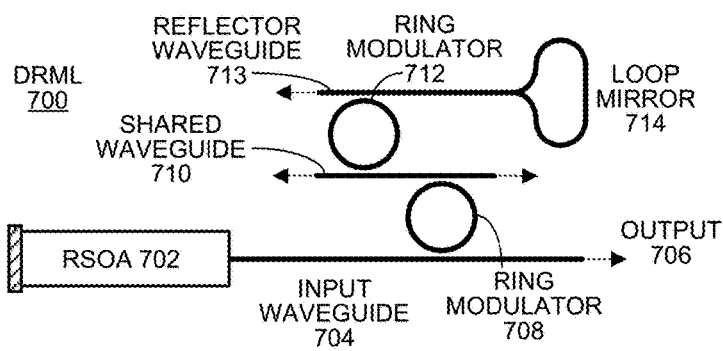
FIG. 7A presents an alternative configuration for a dual-ring-modulated laser in accordance with the disclosed embodiments.
Figure 7B:
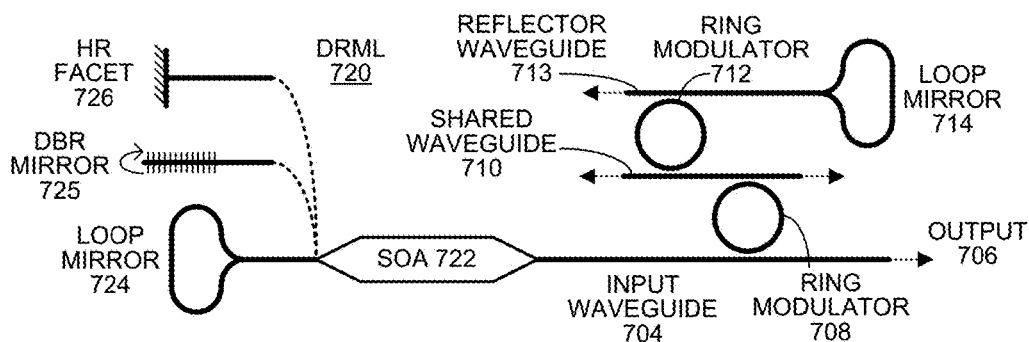
FIG. 7B presents another alternative configuration for a dual-ring-modulated laser in accordance with the disclosed embodiments.
Figure 7C:
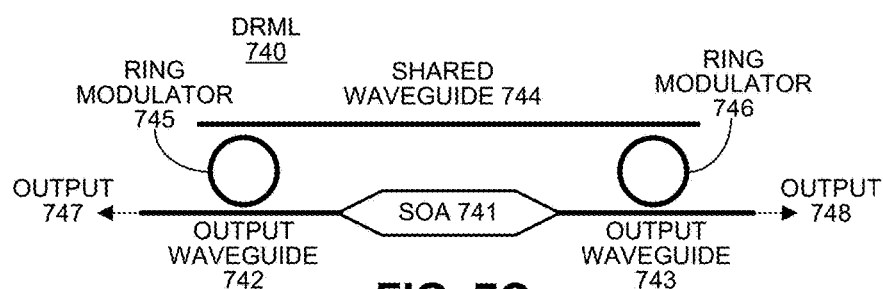
FIG. 7C presents yet another alternative configuration for a dual-ring-modulated laser in accordance with the disclosed embodiments.

In addition to the configuration illustrated in FIG. 5A, a number of different DRML configurations are possible as are illustrated in FIGS. 7A-7C, wherein each of these configurations has the same basic operating principle.

FIG. 7A illustrates another DRML 700, comprising an input waveguide 704 optically coupled to a first ring modulator 708, which is optically coupled to second ring modulator 712 through a shared waveguide 710. Ring modulator 712 is itself optically coupled to a reflector (loop mirror 714) through a reflector waveguide 713. During operation, an optical signal from RSOA 702 traverses a path that passes through the input waveguide 704, circulates around the ring modulator 708, passes through the shared waveguide 710, circulates around ring modulator 712, and passes through reflector waveguide 713 to loop mirror 714, which reflects the light back down the path in a reverse direction to RSOA 702.

FIG. 7B illustrates another DRML 720. DRML 720 is a variation of the configuration illustrated in FIG. 7A, wherein RSOA 702 is replaced with SOA 722, and the high-reflectivity facet of the RSOA 702 is replaced with a loop mirror 724. In other variations, loop mirror 724 can be replaced with a distributed Bragg reflector (DBR) mirror 725, or a high-reflectivity facet 726 in built-in silicon. (This configuration may be particularly useful for hybrid epitaxial III-V on silicon bonded devices.)

FIG. 7C illustrates yet another DRML 740, which is a variation on the configuration illustrated in FIG. 5A, with one of the ring modulators 745 replacing the loop mirror 724 of SOA 722, and wherein reflector waveguide 713 and loop mirror 714 are removed. This configuration includes an SOA 741, which is coupled between output waveguides 742 and 743, which produce outputs 744 and 745, respectively. Note that output waveguides 742 and 743 are coupled to each other through a shared waveguide 744. This configuration is compatible with hybrid epitaxial III-V on silicon bonding, which can be used to insert SOA 741 between output waveguides 742 and 743, which produce outputs 747 and 748, respectively. Also note that both ring modulators 745 and 746 are critically coupled to their corresponding output waveguides 742 and 743.

During operation, SOA 741 generates a first optical signal that passes through the output waveguide 742 and is split through partial optical coupling with the ring modulator 745 to produce: a first output component that provides an output 744 for the laser, and a reflected component. This reflected component: circulates clockwise in ring modulator 745; passes through shared waveguide 744; circulates clockwise in ring modulator 746; and returns through output waveguide 743 to SOA 741. SOA 741 also generates a second optical signal that passes through the output waveguide 743 and is split through partial optical coupling with the ring modulator 746 to produce: an output component that provides an output 745 for the laser, which is complementary to output 744, and a reflected component. This reflected component: circulates counterclockwise in ring modulator 746; passes through shared waveguide 744; circulates counterclockwise in ring modulator 745; and returns through the output waveguide 742 to SOA 741.

Other Variations

An important feature of the DRML taught herein is the ability to integrate the laser gain medium onto a waveguide so as to create a laser cavity that includes the gain medium and a microring. There are multiple platforms and integration strategies that can accomplish this. This DRML can be entirely fabricated in a III-V semiconductor material, making the gain, waveguide, and microring integration straightforward. Another exemplary embodiment comprises silicon waveguides and silicon microrings built on a silicon-on-insulator substrate. Also, the inclusion of Ge-based gain media into an SOI platform can allow for the device to be built with group IV semiconductors. Yet another approach makes use of an SOI platform to create the waveguides and microrings, which are hybrid-integrated to a III-V gain medium. This hybrid integration can take several forms. One approach is to abut the gain medium to the SOI substrate. Another approach is to use wafer-bonding to allow light to evanescently couple to the gain medium from the SOI waveguide and back to the SOI waveguide upon exit from the gain medium. Yet another approach is to use grating couplers on the SOI waveguide together with either angled mirrors or gratings on the III-V gain medium to create a hybrid cavity.

Operation

Figure 8A:
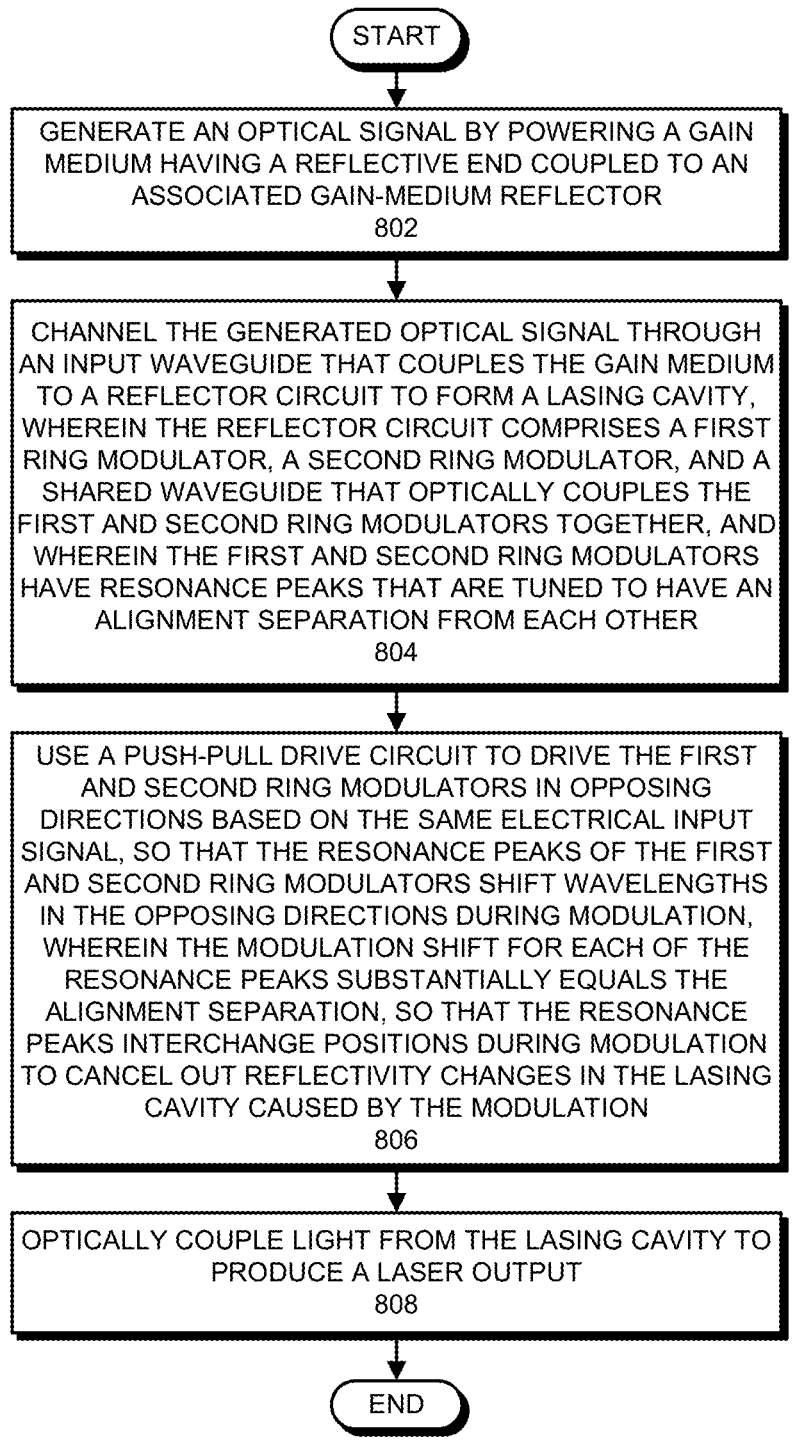
FIG. 8A illustrates a flow chart that describes the operation of a dual-ring-modulated laser that operates using push-pull modulation in accordance with the disclosed embodiments.

FIG. 8A presents a flow chart that describes the operation of a dual-ring-modulated laser system that operates using push-pull modulation in accordance with the disclosed embodiments. During operation, the system first generates an optical signal by powering a gain medium having a reflective end coupled to a shared gain-medium reflector (step 802). Next, the system channels the generated optical signal through an input waveguide that couples the gain medium to a reflector circuit to form a lasing cavity, wherein the reflector circuit comprises a first ring modulator, a second ring modulator, and a shared waveguide that optically couples the first and second ring modulators together, and wherein the first and second ring modulators have resonance peaks that are tuned to have an alignment separation from each other (step 804). The system then uses a push-pull drive circuit to drive the first and second ring modulators in opposing directions based on the same electrical input signal, so that the resonance peaks of the first and second ring modulators shift wavelengths in opposing directions during modulation, wherein the modulation shift for each of the resonance peaks substantially equals the alignment separation, so that the resonance peaks interchange positions during modulation to cancel out reflectivity changes in the lasing cavity caused by the modulation (step 806). Finally, the system couples light from the lasing cavity to at least one output (step 808).

Figure 8B:
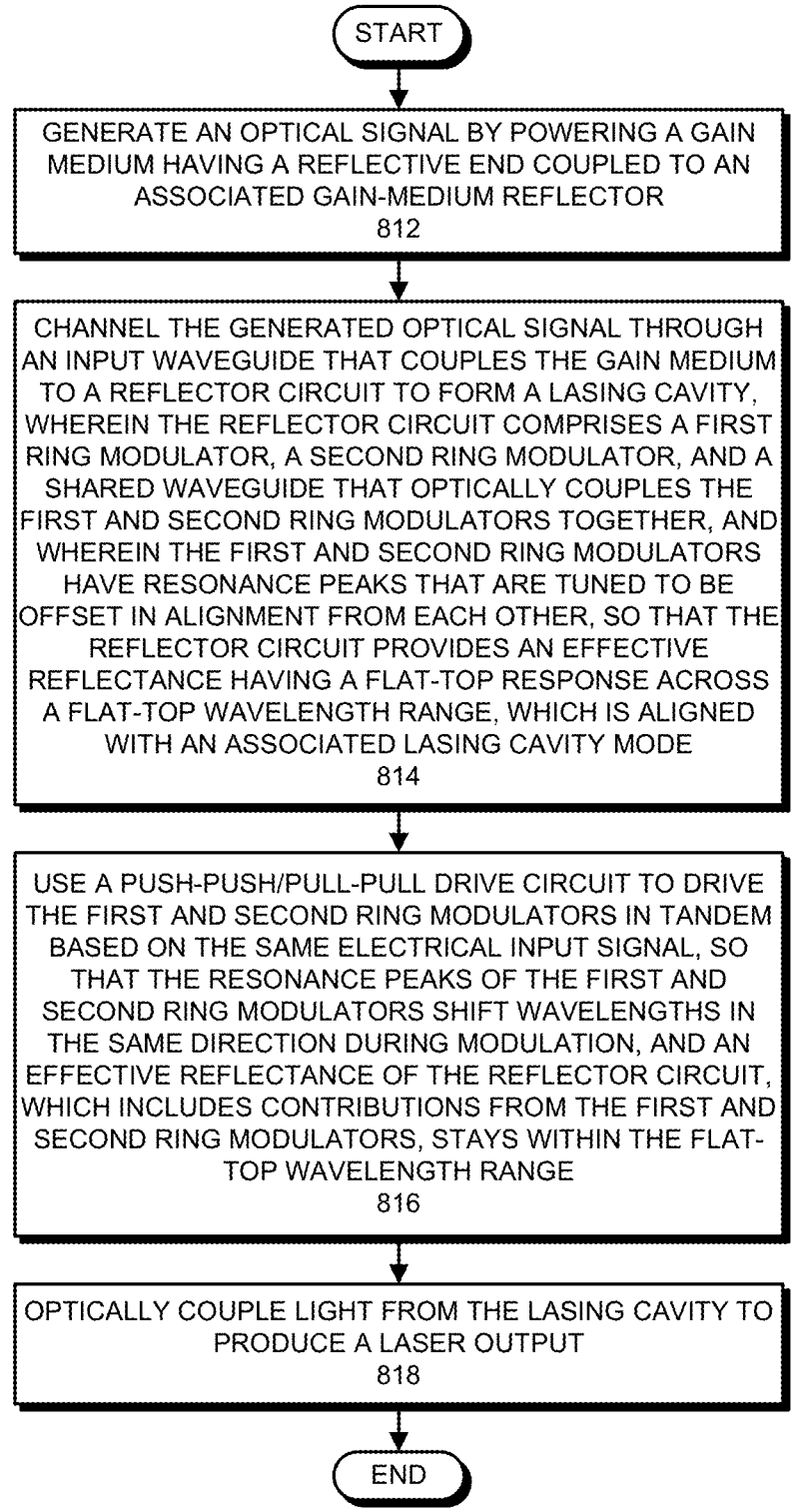
FIG. 8B illustrates a flow chart that describes the operation of a dual-ring-modulated laser that operates using push-push/pull-pull modulation in accordance with the disclosed embodiments.

FIG. 8B presents a flow chart illustrating the operation of a dual-ring-modulated laser system that operates using push-push/pull-pull modulation in accordance with the disclosed embodiments. During operation, the system generates an optical signal by powering a gain medium having a reflective end coupled to a shared gain-medium reflector (step 812). Next, the system channels the generated optical signal through an input waveguide that couples the gain medium to a reflector circuit to form a lasing cavity, wherein the reflector circuit comprises a first ring modulator, a second ring modulator, and a shared waveguide that optically couples the first and second ring modulators together, and wherein the first and second ring modulators have resonance peaks that are tuned to be offset in alignment from each other, so that the reflector circuit provides an effective reflectance having a flat-top response across a flat-top wavelength range, which is aligned with an associated lasing cavity mode (step 814). The system then uses a push-push/pull-pull drive circuit to drive the first and second ring modulators in tandem based on the same electrical input signal, so that the resonance peaks of the first and second ring modulators shift wavelengths in the same direction during modulation, and an effective reflectance of the reflector circuit, which includes contributions from the first and second ring modulators, stays within the flat-top wavelength range (step 816). Finally, the system couples light from the lasing cavity to at least one output (step 818).

System

Figure 9:
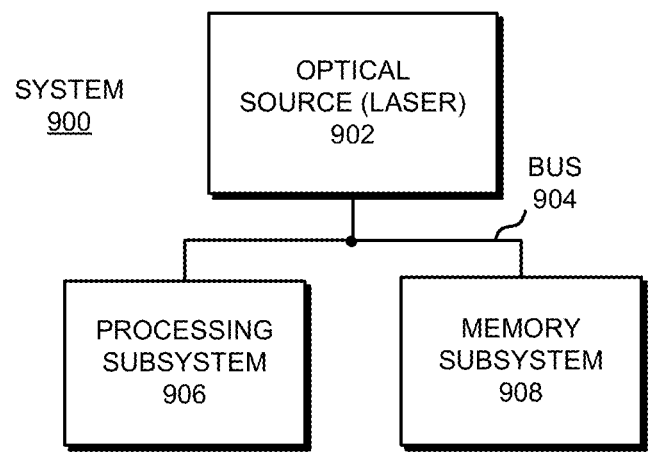
FIG. 9 illustrates a system that includes an optical source, such as a laser, in accordance with an embodiment of the present disclosure.

One or more of the preceding embodiments of the tunable laser may be included in a system or device. More specifically, FIG. 9 illustrates a system 900 that includes an optical source 902, such as a tunable laser. System 900 also includes a processing subsystem 906 (with one or more processors) and a memory subsystem 908 (with memory).

In general, components within optical source 902 and system 900 may be implemented using a combination of hardware and/or software. Thus, system 900 may include one or more program modules or sets of instructions stored in a memory subsystem 908 (such as DRAM or another type of volatile or non-volatile computer-readable memory), which, during operation, may be executed by processing subsystem 906. Furthermore, instructions in the various modules in memory subsystem 908 may be implemented in: a high-level procedural language, an object-oriented programming language, and/or in an assembly or machine language. Note that the programming language may be compiled or interpreted, e.g., configurable or configured, to be executed by the processing subsystem.

Components in system 900 may be coupled by signal lines, links or buses, for example bus 904. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 900 may be at one location or may be distributed over multiple, geographically dispersed locations.

System 900 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 902 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A dual-ring-modulated laser, comprising:
a gain medium having a reflective end coupled to an associated gain-medium reflector;
a reflector circuit comprising a first ring modulator, a second ring modulator, a shared waveguide that optically couples the first and second ring modulators together, wherein the first and second ring modulators have resonance peaks that are tuned to be offset in alignment from each other, so that the reflector circuit provides an effective reflectance having a flat-top response across a flat-top wavelength range, which is aligned with an associated lasing cavity mode;
an input waveguide that couples the gain medium to the reflector circuit to form a lasing cavity;
a push-push/pull-pull drive circuit that drives the first and second ring modulators in tandem based on the same electrical input signal, so that the resonance peaks of the first and second ring modulators shift wavelengths in the same direction during modulation, and an effective reflectance of the reflector circuit, which includes contributions from the first and second ring modulators, stays within the flat-top wavelength range; and
at least one output, which is optically coupled to the lasing cavity.

2. The dual-ring-modulated laser of claim 1, wherein the reflector circuit additionally comprises:
a first intermediate waveguide optically coupled to the first ring modulator;
a second intermediate waveguide optically coupled to the second ring modulator; and
an optical splitter, which splits an optical signal received from the input waveguide to produce a first optical signal that feeds into the first intermediate waveguide, and a second optical signal that feeds into the second intermediate waveguide;
wherein the first optical signal on the first intermediate waveguide is split through partial optical coupling with the first ring modulator to produce a first output component that provides a first output for the laser, and a first reflected component that circulates clockwise in the first ring modulator, passes through the shared waveguide, circulates clockwise in the second ring modulator, and returns through the second intermediate waveguide and the optical splitter to the gain medium; and
wherein the second optical signal on the second intermediate waveguide is split through partial optical coupling with the second ring modulator to produce a second output component that provides a second output for the laser, which is complementary to the first output, and a second reflected component that circulates counterclockwise in the second ring modulator, passes through the shared waveguide, circulates counterclockwise in the first ring modulator, and returns through the first intermediate waveguide and the optical splitter to the gain medium.

3. The dual-ring-modulated laser of claim 1, wherein the reflector circuit additionally comprises:
a reflector; and
a reflector waveguide;
wherein the input waveguide is optically coupled to the first ring modulator, the first ring modulator is optically coupled to the second ring modulator through the shared waveguide, and the second ring modulator is optically coupled to the reflector though the reflector waveguide; and
wherein an optical signal from the gain medium traverses a path that passes through the input waveguide, circulates around the first ring modulator, passes through the shared waveguide, circulates around the second ring modulator, and passes through the reflector waveguide to the reflector, which reflects the light back down the path in a reverse direction to the gain medium.

4. The dual-ring-modulated laser of claim 1, wherein an end of the input waveguide, which is opposite to an end coupled to the gain medium, provides an output for the laser.

5. The dual-ring-modulated laser of claim 1,
wherein the input waveguide is optically coupled to the first ring modulator;
wherein the gain-medium reflector comprises a reflector waveguide, which is connected to the reflective end of the gain medium and is optically coupled to the second ring modulator;
wherein the gain medium generates a first optical signal that passes through the input waveguide and is split through partial optical coupling with the first ring modulator to produce a first output component that provides a first output for the laser, and a first reflected component that circulates counterclockwise in the first ring modulator, passes through the shared waveguide, circulates counterclockwise in the second ring modulator, and returns through the reflector waveguide to the gain medium; and
wherein the gain medium generates a second optical signal that passes through the reflector waveguide and is split through partial optical coupling with the second ring modulator to produce a second output component that provides a second output for the laser, which is complementary to the first output, and a second reflected component that circulates clockwise in the second ring modulator, passes through the shared waveguide, circulates clockwise in the first ring modulator, and returns through the input waveguide to the gain medium.

6. The dual-ring-modulated laser of claim 1, wherein the first and second ring modulators have different radii, which causes a Vernier effect that provides a combined tuning range that is larger than the gain bandwidth of the gain medium.

7. The dual-ring-modulated laser of claim 1, wherein the gain-medium reflector comprises one of the following:
a reflective facet coupled to the reflective end of the gain medium, whereby the gain medium comprises a reflective semiconductor optical amplifier (RSOA);
a waveguide loop mirror coupled to the reflective end of the gain medium; and
a distributed Bragg waveguide (DBR) mirror coupled to the reflective end of the gain medium.

8. The dual-ring-modulated laser of claim 1, wherein the gain medium is located on a gain chip, which is separate from a semiconductor chip that includes the reflector circuit and other components of the dual-ring-modulated laser.

9. A system, comprising:
at least one processor;
at least one memory coupled to the at least one processor; and
an optical transmitter for communicating optical signals generated by the system, wherein the optical transmitter includes a dual-ring-modulated laser comprising:
a gain medium having a reflective end coupled to an associated gain-medium reflector;
a reflector circuit comprising a first ring modulator, a second ring modulator, a shared waveguide that optically couples the first and second ring modulators together, wherein the first and second ring modulators have resonance peaks that are tuned to be offset in alignment from each other, so that the reflector circuit provides an effective reflectance having a flat-top response across a flat-top wavelength range, which is aligned with an associated lasing cavity mode;
an input waveguide that couples the gain medium to the reflector circuit to form a lasing cavity;
a push-push/pull-pull drive circuit that drives the first and second ring modulators in tandem based on the same electrical input signal, so that the resonance peaks of the first and second ring modulators shift wavelengths in the same direction during modulation, and an effective reflectance of the reflector circuit, which includes contributions from the first and second ring modulators, stays within the flat-top wavelength range; and
at least one output, which is optically coupled to the lasing cavity.

10. The system of claim 9, wherein the reflector circuit additionally comprises:
a first intermediate waveguide optically coupled to the first ring modulator;
a second intermediate waveguide optically coupled to the second ring modulator; and
an optical splitter, which splits an optical signal received from the input waveguide to produce a first optical signal that feeds into the first intermediate waveguide, and a second optical signal that feeds into the second intermediate waveguide;
wherein the first optical signal on the first intermediate waveguide is split through partial optical coupling with the first ring modulator to produce a first output component that provides a first output for the laser, and a first reflected component that circulates clockwise in the first ring modulator, passes through the shared waveguide, circulates clockwise in the second ring modulator, and returns through the second intermediate waveguide and the optical splitter to the gain medium; and
wherein the second optical signal on the second intermediate waveguide is split through partial optical coupling with the second ring modulator to produce a second output component that provides a second output for the laser, which is complementary to the first output, and a second reflected component that circulates counterclockwise in the second ring modulator, passes through the shared waveguide, circulates counterclockwise in the first ring modulator, and returns through the first intermediate waveguide and the optical splitter to the gain medium.

11. The system of claim 9, wherein the reflector circuit additionally comprises:
a reflector; and
a reflector waveguide;
wherein the input waveguide is optically coupled to the first ring modulator, the first ring modulator is optically coupled to the second ring modulator through the shared waveguide, and the second ring modulator is optically coupled to the reflector though the reflector waveguide; and
wherein an optical signal from the gain medium traverses a path that passes through the input waveguide, circulates around the first ring modulator, passes through the shared waveguide, circulates around the second ring modulator, and passes through the reflector waveguide to the reflector, which reflects the light back down the path in a reverse direction to the gain medium.

12. The system of claim 11, wherein an end of the input waveguide, which is opposite to an end coupled to the gain medium, provides an output for the laser.

13. The system of claim 9,
wherein the input waveguide is optically coupled to the first ring modulator;
wherein the gain-medium reflector comprises a reflector waveguide, which is connected to the reflective end of the gain medium and is optically coupled to the second ring modulator;
wherein the gain medium generates a first optical signal that passes through the input waveguide and is split through partial optical coupling with the first ring modulator to produce a first output component that provides a first output for the laser, and a first reflected component that circulates counterclockwise in the first ring modulator, passes through the shared waveguide, circulates counterclockwise in the second ring modulator, and returns through the reflector waveguide to the gain medium; and
wherein the gain medium generates a second optical signal that passes through the reflector waveguide and is split through partial optical coupling with the second ring modulator to produce a second output component that provides a second output for the laser, which is complementary to the first output, and a second reflected component that circulates clockwise in the second ring modulator, passes through the shared waveguide, circulates clockwise in the first ring modulator, and returns through the input waveguide to the gain medium.

14. The system of claim 9, wherein the first and second ring modulators have different radii, which causes a Vernier effect that provides a combined tuning range that is larger than the gain bandwidth of the gain medium.

15. The system of claim 9, wherein the gain-medium reflector comprises one of the following:
   a reflective facet coupled to the reflective end of the gain medium, whereby the gain medium comprises a reflective semiconductor optical amplifier (RSOA);
   a waveguide loop mirror coupled to the reflective end of the gain medium; and
   a distributed Bragg waveguide (DBR) mirror coupled to the reflective end of the gain medium.

16. The system of claim 9, wherein the gain medium is located on a gain chip, which is separate from a semiconductor chip that includes the reflector circuit and other components of the dual-ring-modulated laser.

17. A method for operating a dual-ring-modulated laser, comprising:
   generating an optical signal by powering a gain medium having a reflective end coupled to an associated gain-medium reflector;
   channeling the generated optical signal through an input waveguide that couples the gain medium to a reflector circuit to form a lasing cavity, wherein the reflector circuit comprises a first ring modulator, a second ring modulator, and a shared waveguide that optically couples the first and second ring modulators together, and wherein the first and second ring modulators have resonance peaks that are tuned to be offset in alignment from each other, so that the reflector circuit provides an effective reflectance having a flat-top response across a flat-top wavelength range, which is aligned with an associated lasing cavity mode;
   using a push-push/pull-pull drive circuit to drive the first and second ring modulators in tandem based on the same electrical input signal, so that the resonance peaks of the first and second ring modulators shift wavelengths in the same direction during modulation, and an effective reflectance of the reflector circuit, which includes contributions from the first and second ring modulators, stays within the flat-top wavelength range; and
   optically coupling light from the lasing cavity to at least one output.

18. The method of claim 17, wherein the first and second ring modulators have different radii, which causes a Vernier effect that provides a combined tuning range that is larger than the gain bandwidth of the gain medium.

19. The method of claim 17, wherein the gain-medium reflector comprises one of the following:
   a reflective facet coupled to the reflective end of the gain medium so that the gain medium and the reflective facet form a reflective semiconductor optical amplifier (RSOA);
   a waveguide loop mirror coupled to the reflective end of the gain medium; and
   a distributed Bragg waveguide (DBR) mirror coupled to the reflective end of the gain medium.

20. The method of claim 17, wherein the gain medium is located on a gain chip, which is separate from a semiconductor chip that includes the reflector circuit and other components of the dual-ring-modulated laser.

\* \* \* \* \*